United States Patent
Ku

(10) Patent No.: US 8,826,219 B2
(45) Date of Patent: Sep. 2, 2014

(54) METHOD AND APPARATUS USED FOR THE PHYSICAL VALIDATION OF INTEGRATED CIRCUITS

(75) Inventor: Chiu-Yu Ku, Taipei (TW)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/504,845

(22) PCT Filed: Oct. 28, 2010

(86) PCT No.: PCT/IB2010/002782
§ 371 (c)(1),
(2), (4) Date: Apr. 27, 2012

(87) PCT Pub. No.: WO2011/051797
PCT Pub. Date: May 5, 2011

(65) Prior Publication Data
US 2012/0216162 A1 Aug. 23, 2012

(30) Foreign Application Priority Data
Oct. 30, 2009 (CN) .......................... 2009 1 0211392

(51) Int. Cl.
*G06F 17/50* (2006.01)
(52) U.S. Cl.
CPC .................... *G06F 17/5081* (2013.01)
USPC ........... 716/136; 716/106; 716/107; 716/110; 716/111; 703/13; 703/14
(58) Field of Classification Search
USPC .................. 716/106–107, 110–111, 136; 703/13–14
See application file for complete search history.

(56) References Cited

U.S. PATENT DOCUMENTS

| | | | | |
|---|---|---|---|---|
| 6,134,513 | A * | 10/2000 | Gopal | 703/14 |
| 6,757,874 | B1 | 6/2004 | Dahl et al. | |
| 7,107,559 | B2 | 9/2006 | Lakshmanan et al. | |
| 7,480,878 | B2 | 1/2009 | Holesovsky et al. | |
| 7,503,023 | B1 * | 3/2009 | Kainuma et al. | 716/136 |
| 7,571,409 | B2 * | 8/2009 | Otsuka | 716/119 |
| 2009/0313596 | A1 | 12/2009 | Lippmann et al. | |

FOREIGN PATENT DOCUMENTS

CN 1760879 A 4/2006

OTHER PUBLICATIONS

Notification Concerning Transmittal dated May 10, 2012, the International Preliminary Report on Patentability (Chapter I of the Patent Cooperation Treaty) and the Written Opinion of the International Searching Authority from the corresponding International Application No. PCT/IB2010/002782 filed Oct. 28, 2010.

* cited by examiner

*Primary Examiner* — Nghia Doan
(74) *Attorney, Agent, or Firm* — Young, Basile, Hanlon & MacFarlane, P.C.

(57) ABSTRACT

Disclosed herein are methods and devices used for the physical design validation of integrated circuits. One method used for the physical design validation of integrated circuits includes comparing the original circuit netlist of an integrated circuit and the layout data of the integrated circuit and assigning labels to the input and output terminals of the components in the integrated circuit based on the results of the comparison.

9 Claims, 8 Drawing Sheets

METHOD AND APPARATUS USED FOR THE PHYSICAL VALIDATION OF INTEGRATED CIRCUITS

TECHNICAL FIELD

The present invention involves a validation method and apparatus for integrated circuit design, especially a method and apparatus used for the physical design validation of integrated circuits.

BACKGROUND

The consistent improvement in manufacturing technology for integrated circuits has led to the continuous decline in the minimum size of integrated circuit chips. Due to the trend of decreasing chip sizes, however, during the physical design it is more and more necessary to take into consideration the influence that manufacturability exerts on the yield and reliability of the integrated circuit chip. In light of the above, besides the testing and validation phases after manufacturing the physical integrated circuit chip, the physical design validation of integrated circuits is also an important step in the circuit design process.

In the physical design validation process for all kinds of integrated circuits, the physical design validation process is to identify whether the design of a certain integrated circuit satisfies all the process rules. Geometric design rules ensure said circuit is manufactured correctly by inspecting the relative position and syntax of a circuit's final layout. The testing of the functional correctness is to be completed with the assistance of verifier and simulator that model the operation and behavior of the circuit. An electrical rule check or design rule check is used for processing the layout syntax and analyzing the complicated behavior. Electrical rules involve related attribute specifications of a certain circuit, which are determined by geometrical and connection relationships.

Among various software and hardware methods for the physical design validation of integrated circuits, layout versus schematic (LVS) software is used to identify whether the original circuit netlist of an integrated circuit is in conformity with the graphical data of said circuit. Said LVS will first create a layout circuit netlist according to the graphical data of said circuit, and then make a comparison between said original circuit netlist and said LVS. If it turns out to be conflicting, the circuit designer can correct the layout and the routing according to the comparison results, creating new graphical data, and then compare said original circuit netlist and the new graphical data once again.

However, whether the circuit designer creates the layout of said integrated circuit according to the original circuit netlist of an integrated circuit, or corrects the layout of said integrated circuit according to the comparison results provided by the layout versus schematic software, two circuits are likely to be connected from two different signal networks in the process of making the layout in both situations, leading to a mistake called a "short circuit". A short circuit often occurs in the power supply network and the grounding system, but it also includes incorrect connections of various signal networks, not limited to short circuits of the power supply network and the grounding system.

Due to the fact that short circuits of integrated circuit take place within the layout of the integrated circuit, it is difficult to locate the position of the short circuit manually. As a result, in order to solve the short circuit problem in the integrated circuit, software has been created for physical design validation to locate the position of short circuits in integrated circuits. FIG. 1 is a flowchart for locating the position of short circuits in an existing integrated circuit. In Step 102, labels of an integrated circuit are entered according to an edit file set up by the user or a data file of the circuit layout, and then go to Step 104. In Step 104, according to the labels in said integrated circuit, the positions of possible short circuits in said integrated circuit are located.

FIG. 2 is a partial diagram of the short circuit in an integrated circuit. As is shown, said integrated circuit 200 includes components 202, 204 and 206, with each of these components 202, 204, and 206 including four input and output terminals. Said components 202, 204 and 206 are connected by a power supply network and a grounding system, while the metal wire 250 across said power supply network and said grounding system causes a short circuit.

Let's assume the method in FIG. 1 of searching for the position of the short circuit in an existing integrated circuit was applied to the integrated circuit 200 in FIG. 2. In Step 102, the user enters a power supply network VDD at endpoint A, and enters a grounding system VSS at endpoint B. In Step 104, according to the labels VDD and VSS in said integrated circuit, the position of a possible short circuit in said integrated circuit 200 could be located.

However, there exist many drawbacks in the current methods of searching for the position of a short circuit in integrated circuits. First, the users might supply labels of an incorrect integrated circuit, which leads to the fact that said searching method is unable to locate the correct position of a short circuit. Second, if the labels of an incorrect integrated circuit are not supplied, the users may provide too few labels of an integrated circuit, which leads to the fact that it might cost a large amount of time for the current method to search for said position of a short circuit in the integrated circuit, or it might even be unable to locate the position of said short circuit at all.

As a result, what the circuit industry needs is an effective method and apparatus, which could reduce dramatically the time needed to search for short circuits in the integrated circuit, and could ensure a more effective flow of the entire integrated circuit design.

SUMMARY

The present invention aims at increasing the labels of a certain integrated circuit widely by assigning labels to the input and output terminals of the components in said integrated circuit according to the comparison results provided by the layout versus schematic. By means of widely increasing said labels, the time needed to search for the position of short circuits in an existing integrated circuit could be reduced dramatically.

The present invention provides a method used for the physical design validation of integrated circuits, which includes the following steps: compare the original circuit netlist of an integrated circuit and the layout data of said integrated circuit; and on the basis of the comparison results, assign labels to the input and output terminals of the components in said integrated circuit.

The present invention provides another method used for the physical design validation of integrated circuits, which includes the following steps: assign labels to the input and output terminals of the components in said integrated circuit according to the results of the comparison between the original circuit netlist of an integrated circuit and the layout data of said integrated circuit; and locate the position of a possible short circuit in said integrated circuit according to the labels in said integrated circuit.

The present invention provides an apparatus used for the physical design validation of integrated circuits, which includes a comparison unit and an assignment unit. Said comparison unit compares the original circuit netlist of an integrated circuit and the layout data of said integrated circuit. Said assignment unit, according to the comparison results provided by said comparison unit, assigns labels to both input and output terminals of the components in said integrated circuit.

The present invention provides another apparatus used for the physical design validation of integrated circuits, which includes an assignment unit and a location-finding unit. Said assignment unit, according to the results of the comparison between the original circuit netlist of an integrated circuit and the layout data of said integrated circuit, assigns labels to the input and output terminals of the components in said integrated circuit. The location-finding unit, according to the labels provided by said assignment unit, locates the position of a possible short circuit in said integrated circuit.

The preceding text has sketched out the technical characteristics of the present invention, allowing the detailed description in the following text to be better understood. Other technical characteristics constituting the claims of the present invention will be described in the following text. The average person skilled in the art which the present invention relates to shall understand that the concepts and the particular embodiments revealed in the following text could be used as foundations and thus achieve the same end as the present invention by making some easy modifications, designing other structures or manufacturing procedures. The average person skilled in the art which the present invention relates to shall also understands that equivalent constructions do not leave the spirit and scope of the present invention covered in the claims attached.

DETAILED DESCRIPTION

A method and an apparatus for the inspection of a kind of integrated circuit's antenna effect are discussed here in the present invention. To understand the present invention thoroughly, the following description will present detailed steps and components. Obviously, the implementation of the present invention is not limited to the specific details that those skilled in the art of circuit design are familiar with. On the other hand, the well-known components or steps will not be described in detail lest there should be unnecessary limitations to the revelation. Some better embodiments of the present invention will be described in detail as follows. However, besides these detailed descriptions, the present invention could also be widely implemented in other embodiments. Moreover, the scope of the present invention is not limited, but subject to the subsequent claims.

In accordance with the method provided by an embodiment of the present invention and used for the physical design validation of integrated circuits, the present invention aims at increasing the labels of a certain integrated circuit widely by assigning labels to the input and output terminals of the components in said integrated circuit according to the comparison results provided by the layout versus schematic.

In accordance with the method provided by another embodiment of the present invention and used for the physical design validation of integrated circuits, one can assign labels in the integrated circuit that is being evaluated according to the method provided by an embodiment of the present invention and used for the physical design validation of integrated circuits, and by means of said labels widely increased, the time needed to search for the position of short circuits in an existing integrated circuit could be reduced dramatically.

Figure 3:
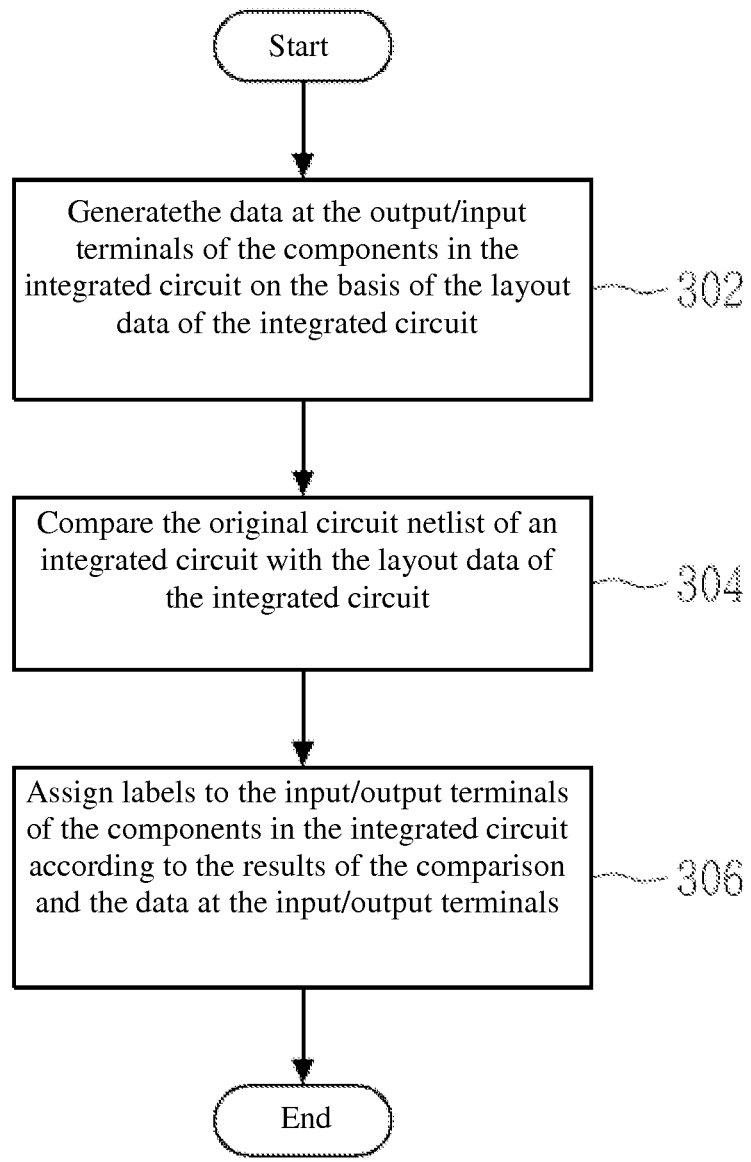
FIG. 3 is a flowchart of the method provided by one embodiment of the present invention and used for the physical design validation of integrated circuits.

FIG. 3 is a flowchart of the method provided by one embodiment of the present invention and used for the physical design validation of integrated circuits. In Step 302, according to the layout data of said integrated circuit, the data at the input and output terminals of the components in said integrated circuit could be generated, and then processing goes to Step 304. In Step 304, the original circuit netlist of an integrated circuit is compared with the layout data of said integrated circuit, and then processing goes to Step 306. In Step 306, labels are assigned to the input and output terminals of the components in said integrated circuit on the basis of the comparison results and the data of said input and output terminals.

In one of the embodiments of the present invention, Step 306 assigns labels to the input and output terminals of the components in accordance with the matching components described in said original circuit netlist. In a second embodiment of the present invention, Step 306 is to assign labels to all the input and output terminals of said matching components in accordance with all the input and output terminals of the matching components in said original circuit netlist as well as the nodes connecting said input terminals and output terminals. In another embodiment of the present invention, the data of said input terminals and output terminals generated in Step 302 include the names of said components, the names of the input and output terminals of the components, the coordinates of the input and output terminals of said components and the depth level of the input and output terminals of said components.

Figure 1:
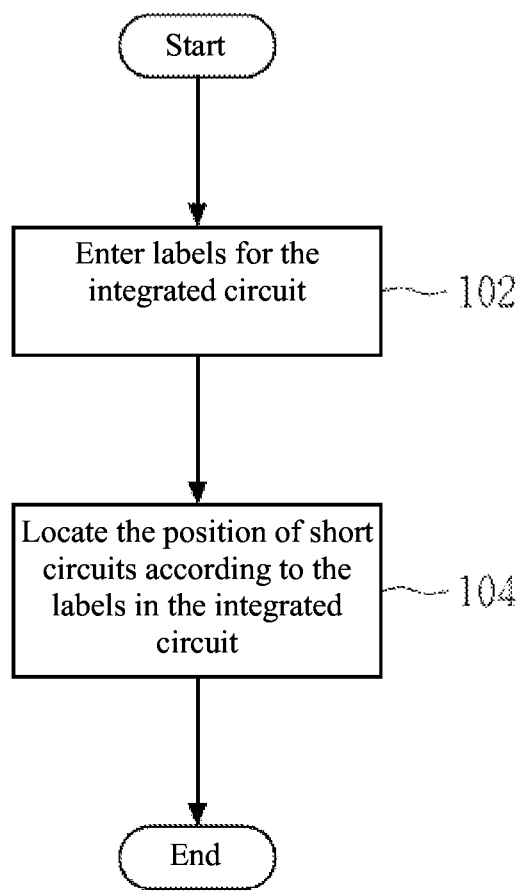
FIG. 1 is a flowchart of the method for locating the position of a short circuit in an existing integrated circuit.
Figure 2:
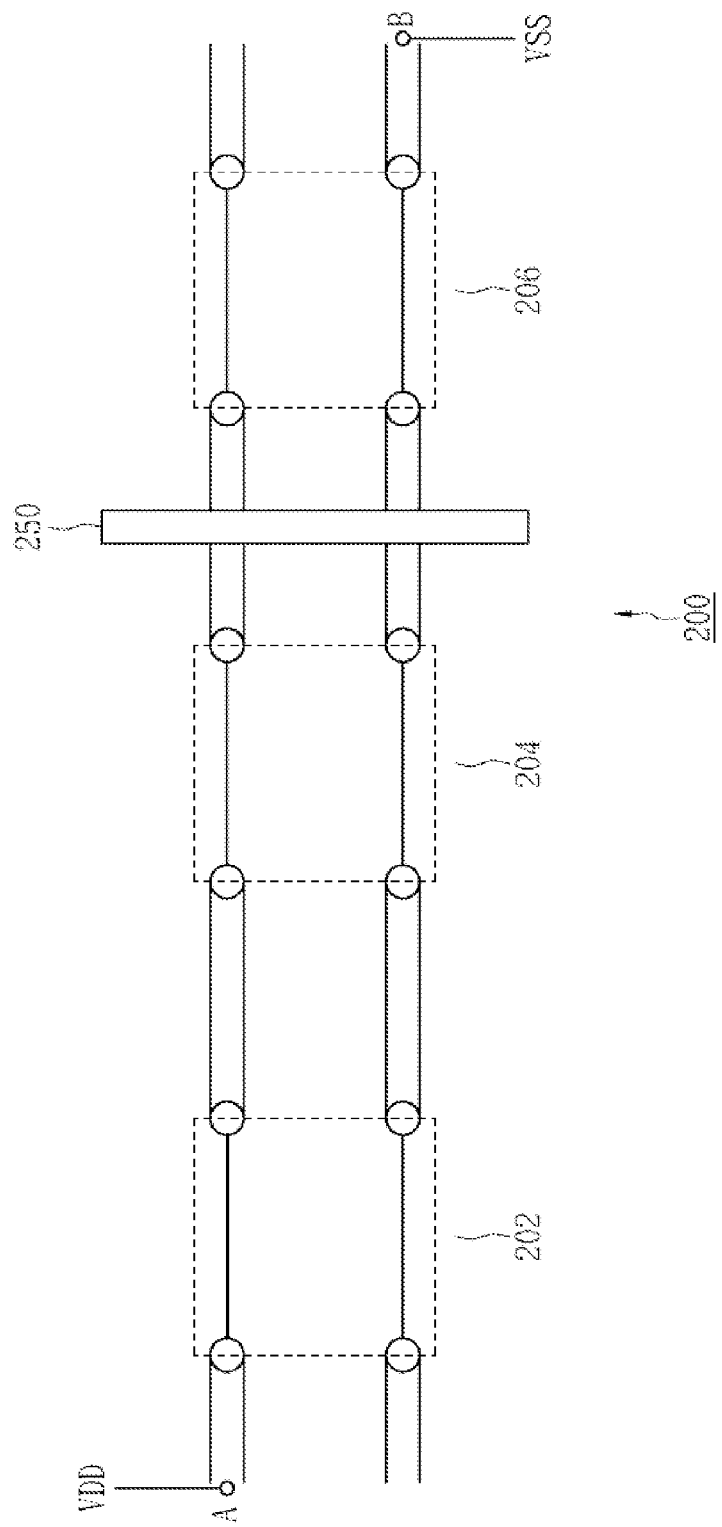
FIG. 2 is the partial diagram of a short circuit in an integrated circuit.

Let's assume said method used for the physical design validation of integrated circuits in FIG. 3 were applied to the integrated circuit 200 in FIG. 2. In Step 302, according to the layout data of said integrated circuit 200, the data at the input and output terminals of the components in said integrated circuit 200 could be generated, namely the data of the four input and output terminals of said components 202, 204 and 206. In Step 304, the original circuit netlist of an integrated circuit 200 is compared with the layout data of said integrated circuit 200, the result of which shows that said components 202, 204 and 206 all match. In Step 306, labels are assigned to the input and output terminals of the components in said integrated circuit 200 on the basis of the comparison results and the data of said input and output terminals. Due to the fact that said components 202, 204 and 206 all match, the data of their input and output terminals also match. As a result, the input and output terminals of said components 202, 204 and 206 are all assigned with corresponding labels. In other words, Step 306, in accordance with the input and output terminals C-N of the matching components 202, 204, 206 described in said original circuit netlist as well as the nodes VDD and VSS connecting said input and output terminals, assigns labels to the input and output terminals of the components in said integrated circuit 200.

Figure 4:
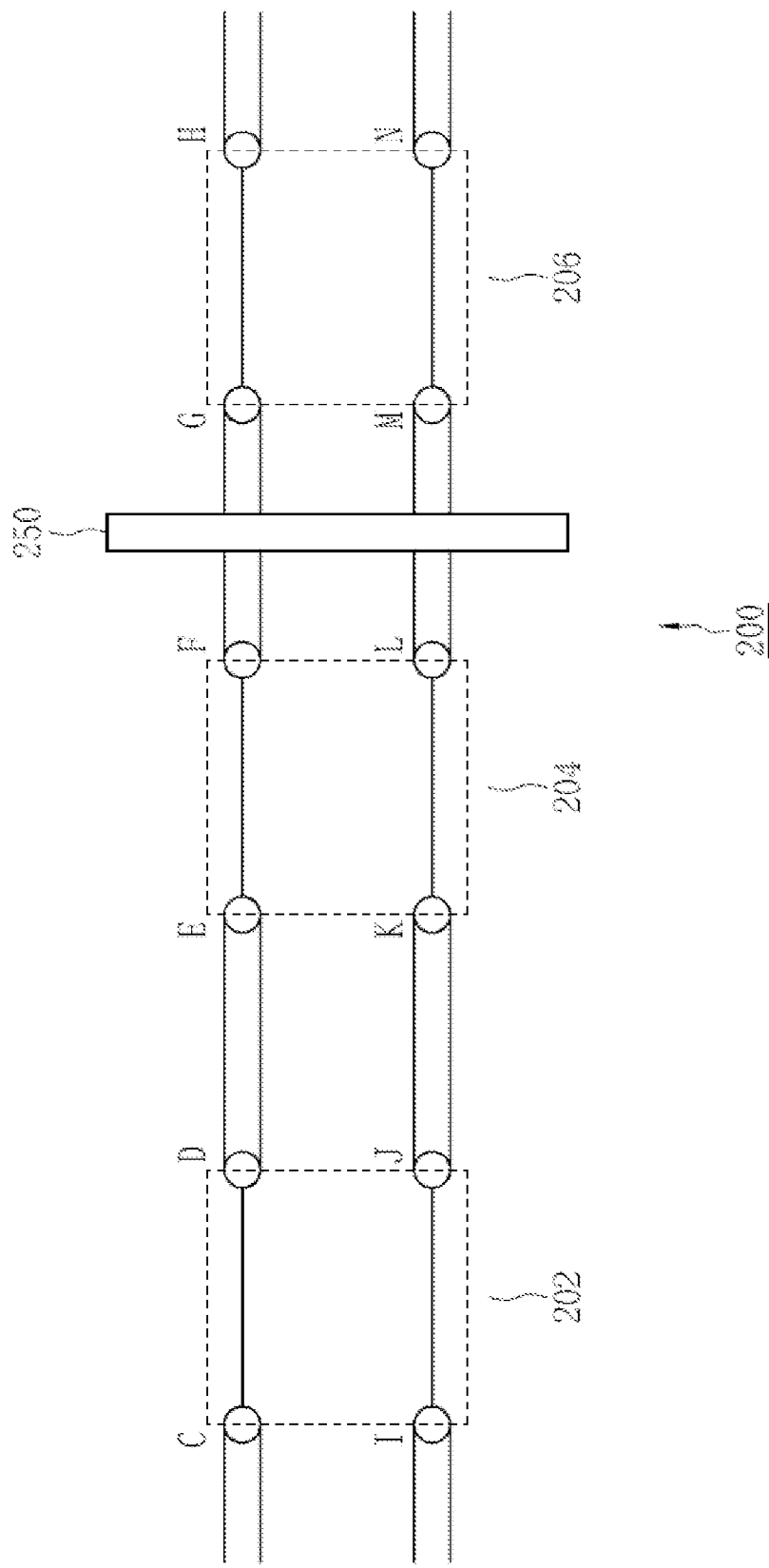
FIG. 4 is a diagram of the assignment of the labels of an integrated circuit according to the application of a particular embodiment of the present invention to the method of the physical design validation of integrated circuits.

FIG. 4 is a diagram of the assignment of labels for said integrated circuit 200 according to the preceding embodiments. As is illustrated in FIG. 4, the input and output terminals C-N of said components 202, 204 and 206 are all assigned with corresponding labels, namely the nodes connecting said input and output terminals C-N, with input and output terminals C-H assigned with VDD and input and output terminals I-N assigned with VSS.

Figure 5:
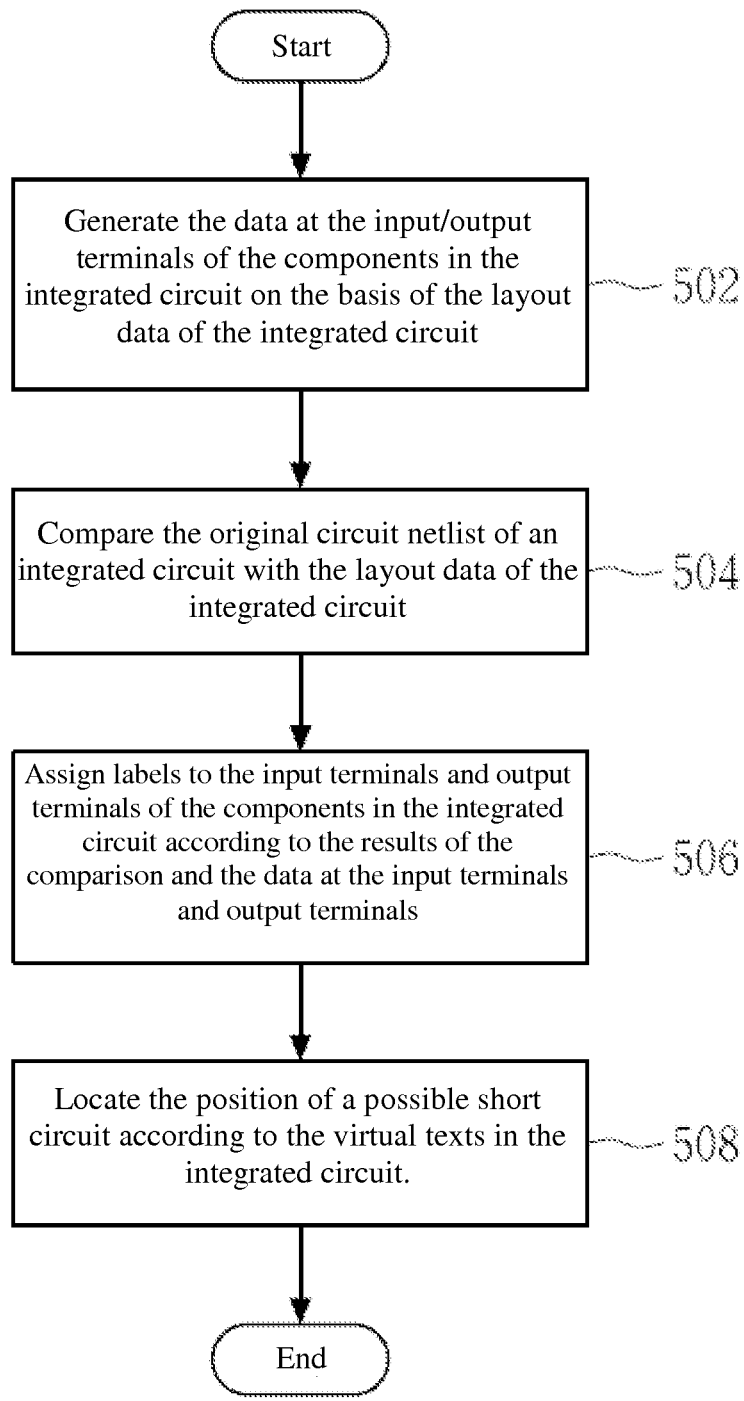
FIG. 5 is a flowchart of the method provided by another embodiment of the present invention and used for the physical design validation of integrated circuits.

FIG. 5 is a flowchart of the method provided by another embodiment of the present invention and used for the physical design validation of integrated circuits. In Step 502, according to the layout data of said integrated circuit, the data at the input and output terminals of the components in said integrated circuit could be generated, and then go to Step 504. In Step 504, compare the original circuit netlist of an integrated circuit with the layout data of said integrated circuit, and then go to Step 506. In Step 506, assign labels to the input and output terminals of the components in said integrated circuit on the basis of the comparison results and the data of said input and output terminals, and then go to Step 508. In Step 508, according to the labels in said integrated circuit, the position of a possible short circuit in said integrated circuit could be located.

As is illustrated in FIG. 5, said method used for the physical design validation of integrated circuits is to search for the position of the short circuit in an integrated circuit by employing the method illustrated in FIG. 3, which is used for the physical design validation of integrated circuits of searching for the position of the short circuit in an integrated circuit. In one of the embodiments of the present invention, Step 506, in accordance with the matching components described in said circuit netlist, assigns labels to their input and output terminals. In a second embodiment of the present invention, Step 506, in accordance with all the input and output terminals of the matching components described in the original circuit netlist as well as the nodes connecting said input and output terminals, assigns labels to all said matching input and output terminals. In a third embodiment of the present invention, the data of said input and output terminals generated in Step 502 include the names of said components, the names of the input and output terminals of the components, the coordinates of the input and output terminals of said components and the depth level of the input and output terminals of said components. In a fourth embodiment of the present invention, Step 508 is to locate the position of a possible short circuit in said integrated circuit according to the labels in said integrated circuit and those of the external inputs. In another embodiment of the present invention, Step 508 performs a shortest path calculation.

Figure 6:
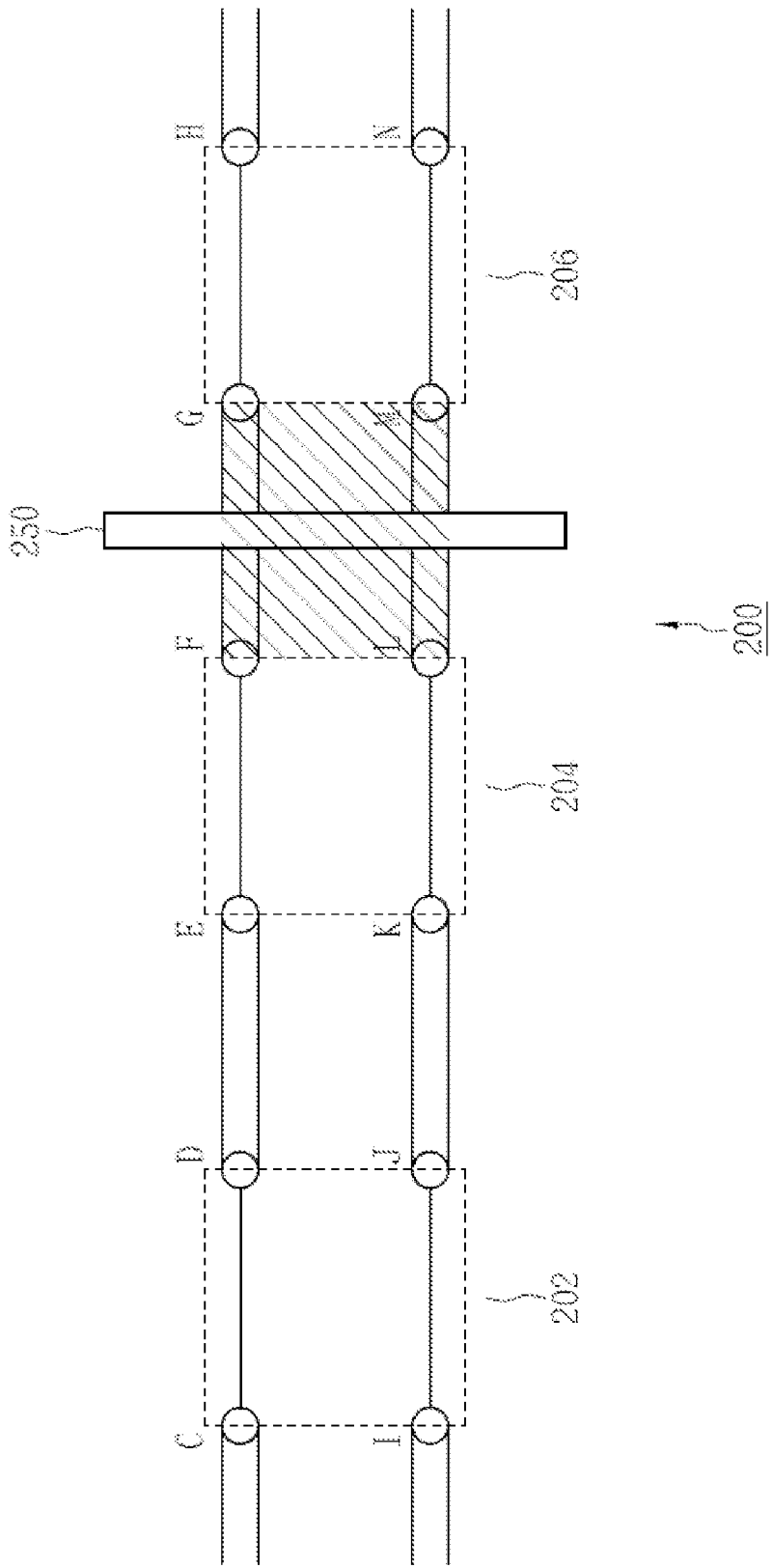
FIG. 6 is a diagram of locating the position of short circuits in an existing integrated circuit according to the method provided by another embodiment of the present invention and used for the physical design validation of integrated circuits.

Let's assume said method used for the physical design validation of integrated circuits in FIG. 5 is applied to the integrated circuit 200 in FIG. 2. From Step 502 to Step 506, the labels of said integrated circuit 200 assigned are illustrated in FIG. 6. As is illustrated in FIG. 6, the input and output terminals C-N of said components 202, 204 and 206 are all assigned with corresponding labels, among which the input and output terminals C-H are assigned with VDD and the input and output terminals I-N with VSS.

In Step 508, according to the labels in said integrated circuit 200, the position of a possible short circuit in said integrated circuit 200 could be located. As is illustrated in FIG. 6, due to the fact that said input and output terminals F, G, L and M are all assigned with corresponding labels, it is only necessary to search for the position of a possible short circuit in said integrated circuit 200 within the signal network comprised of said input and output terminals F, G, L and M. Compared with the partial diagram of the short circuit in the integrated circuit illustrated in FIG. 2, the existing searching method has to search for the position of a short circuit in said integrated circuit 200 within the range between endpoint A and endpoint B. Hereby, as the method used for the physical design validation of integrated circuits provided in this embodiment could significantly narrow the search range, thus dramatically reduce the time cost in searching for the position of the short circuit in an integrated circuit.

Figure 7:
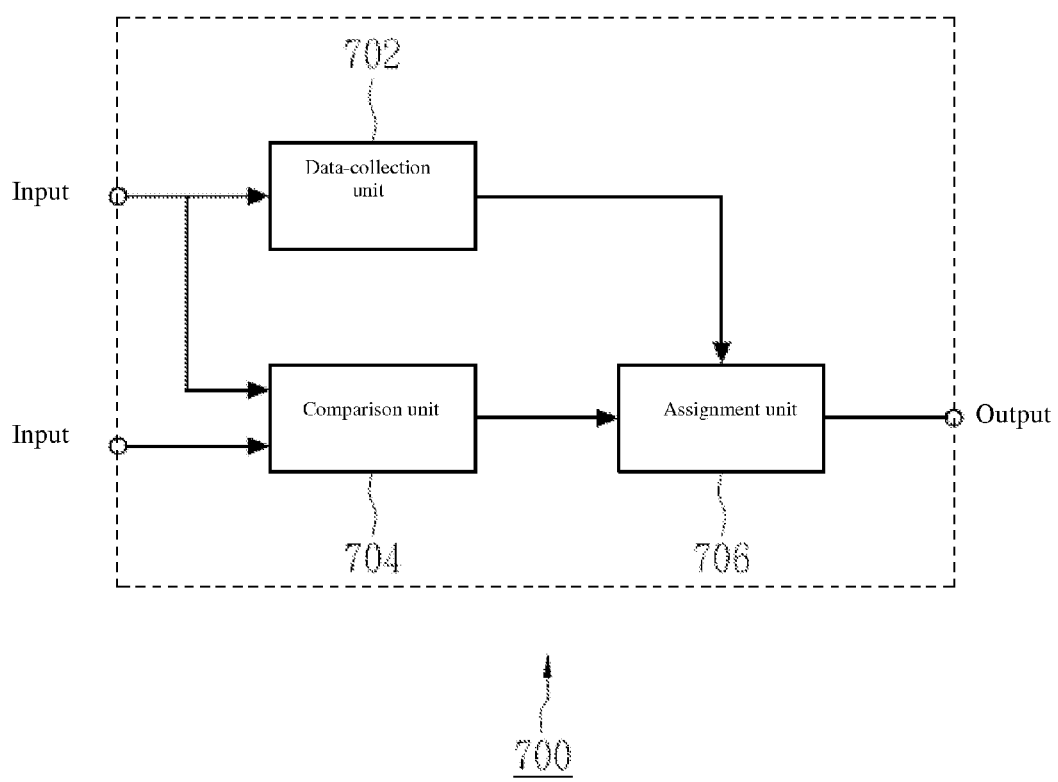
FIG. 7 is a diagram of the apparatus provided by one embodiment of the present invention and used for the physical design validation of integrated circuits.

FIG. 7 is a diagram of the apparatus provided by one embodiment of the present invention and used for the physical design validation of integrated circuits. As is illustrated in FIG. 7, said apparatus 700 includes a data-collection unit 702, a comparison unit 704 and an assignment unit 706. According to the layout data of an integrated circuit, said data-collection unit 702 generates the data at the input and output terminals of the components in said integrated circuit. Said comparison unit 704 compares the original circuit netlist of said integrated circuit with the layout data of said integrated circuit. According to the comparison results provided by said comparison unit 704 and the data at said input and output terminals of the components provided by said data-collection unit 702, said assignment unit 706 assigns labels to the input and output terminals of the components in said integrated circuit.

In one of the embodiments of the present invention, said assignment unit 706, in accordance with the matching components described in said original circuit netlist, assigns labels to the input and output terminals in said integrated circuit. In a second embodiment of the present invention, said assignment unit 706, in accordance with all the input and output terminals of the matching components described in the original circuit netlist as well as the nodes connecting said input and output terminals, assigns labels to all the input and output terminals of said matching components. In another embodiment of the present invention, the data of said input and output terminals generated by the data-collection unit 702 include the names of said components, the names of the input and output terminals of the components, the coordinates of the input and output terminals of said components and the depth level of the input and the output terminals of said components.

The following instance is a partial diagram of the apparatus provided by one embodiment of the present invention and used for the design validation of integrated circuits is applied to the short circuit in the integrated circuit shown in FIG. 2. First, said data-collection unit 702 generates the data at the input and output terminals C-N of said components 204, 206, and 208 in said integrated circuit 200 according to the layout data of the integrated circuit 200. Second, said comparison unit 704 is to compare the original circuit netlist of said integrated circuit 200 with the layout data of said integrated circuit 200. Third, said assignment unit 706 assigns labels to the input and output terminals C-N of the components 204, 206 and 208 in said integrated circuit 200 according to the comparison results and the data at said input and output terminals C-N. Said results of the assignment are illustrated in FIG. 4.

Figure 8:
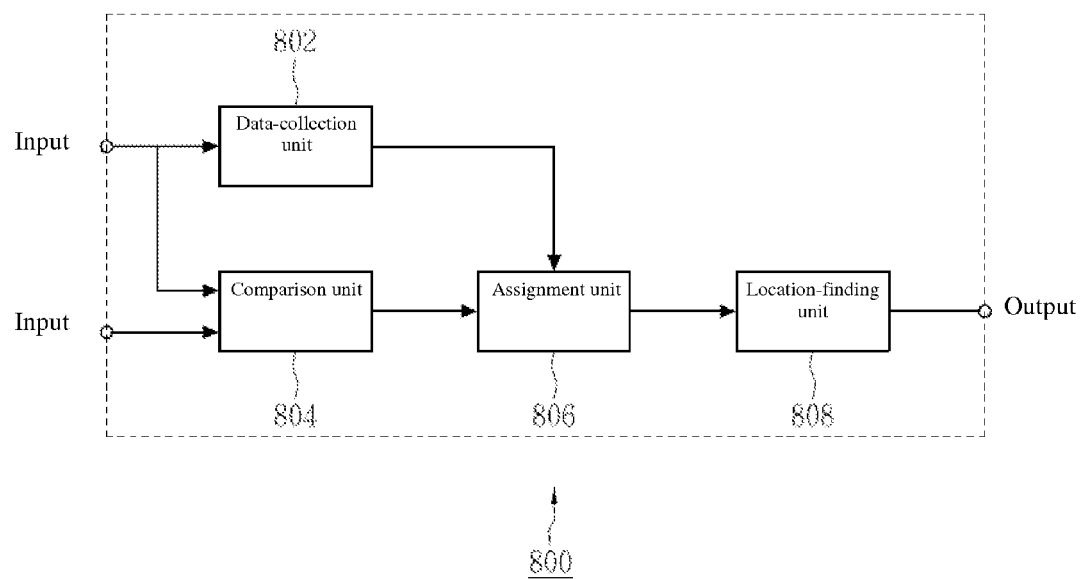
FIG. 8 is a diagram of the apparatus provided by another embodiment of the present invention and used for the physical design validation of integrated circuits.

FIG. 8 is a diagram of the apparatus provided by another embodiment of the present invention and used for the physical design validation of integrated circuits. As is illustrated in FIG. 8, said apparatus 800 includes a data-collection unit 802, a comparison unit 804, an assignment unit 806 and a location-finding unit 808. According to the layout data of an integrated circuit, said data-collection unit 802 generates the data at the input and output terminals of the components in said integrated circuit. Said comparison unit 804 is to compare the original circuit netlist of said integrated circuit with the layout data of said integrated circuit. According to the comparison results provided by said comparison unit 806 and the data at said input and output terminals of the components provided by said data-collection unit 804, said assignment unit 802 assigns labels to the input and output terminals of the components in said integrated circuit. Said location-finding unit 808 is to locate the position of a possible short circuit in said integrated circuit according to the labels provided by said assignment unit 806.

As illustrated in FIG. 8, said apparatus used for the physical design validation of integrated circuits searches for the position of the short circuit in an integrated circuit by employing the apparatus illustrated in FIG. 7, which is used for the physical design validation of integrated circuits. In one embodiment of the present invention, said assignment unit 806, in accordance with the matching components described in the original circuit netlist, assigns labels to the input and output terminals of said components. In a second embodiment of the present invention, said assignment unit 806, in accordance with all the input and output terminals of the matching components described in the original circuit netlist as well as the nodes connecting said input and output terminals, is to assign labels to all of the input and output terminals of said matching components that match in accordance with both input and output terminals of said components that match in said original circuit netlist as well as the nodes connecting said input terminals and output terminals. In a third embodiment of the present invention, the data at said input terminals and output terminals generated by the data-collection unit 802 include the names of said components, the names of the input terminal and output terminals of the components, the coordinates of the input terminal and output terminals of said components and the positions at which the input terminal and the output terminals of said components are located. In a fourth embodiment of the present invention, said location-finding unit 808 is to locate the position of a possible short circuit in said integrated circuit according to the labels in said integrated circuit and those of the external inputs provided by said assignment unit 806. In another embodiment of the present invention, said location-finding unit 808 performs a shortest path calculation.

The following instance is a partial diagram of the apparatus provided by one embodiment of the present invention and used for the design validation of integrated circuits, with this apparatus being applied to the short circuit in the integrated circuit shown in FIG. 2. Similar to the apparatus used for assigning labels in the integrated circuit in FIG. 7, said data-collection unit 802, said comparison unit 804 and said assignment unit 806 work together to assign labels to the input and output terminals C-N of the components in the integrated circuit 200. Thus said location-finding unit 808 locates the position of the short circuit 250 in said integrated circuit 200 according to the labels provided by said assignment unit 806.

The apparatus shown in FIG. 7 and FIG. 8 could be achieved either in the form of hardware or software stored on hardware. For instance, said apparatus could be achieved via a software program operated by a computer.

In conclusion, the method and apparatus used for the physical design validation of integrated circuits provided by one embodiment of the present invention is to assign labels to the input and output terminals of the components in said integrated circuit according to the comparison results provided by the layout versus schematic, among which the number of labels on the input and output terminals of the components assigned according to the comparison results provided by the layout versus schematic is far greater than the number of those entered manually with current technology. Furthermore, the method and apparatus used for the physical design validation of integrated circuits provided by another embodiment of the present invention, according to the method and apparatus used for the physical design validation of integrated circuits provided by one embodiment of the present invention, is to search for the position of a short circuit in said integrated circuit on the basis of the labels of said integrated circuit. The present invention could provide far more labels in the integrated circuit than the current technology could do, therefore, the method and apparatus of the present invention could significantly reduce the range of blocks for positioning the short circuit, so as to achieve the goals of reducing substantially the time spent in searching for short circuits in the integrated circuit.

The technical content and characteristics of the present invention have been disclosed as above. However, those skilled in the art are still likely to make various substitutions and modifications which don't deviate from the spirit of the present invention on the basis of the instructions and revelations of the present invention. Therefore, the scope of protection of the present invention should not be limited to the content revealed by the embodiments, but rather it should include all sorts of substitutions and modifications that don't deviate from the spirit of the present invention and be covered by the claims in the application for this patent.

The invention claimed is:

1. A method used for the physical design validation of an integrated circuit comprising:
  generating data of terminals of components in an integrated circuit according to layout data of the integrated circuit, wherein each component includes a plurality of input and output terminals, the data including one or more of names of the components, names of the terminals and coordinates of the terminals;
  comparing, with a computer, an original circuit netlist of the integrated circuit that includes data of components with the layout data of the integrated circuit;
  assigning labels to the terminals of the components in the integrated circuit according to the data of the terminals and results of the comparison, wherein a matching component between the original circuit netlist and the layout data is assigned a label for each terminal in the matching component representing data of the terminal; and
  locating a position of a short circuit based on the labels of the matching component using a short path calculation.

2. The method according to claim 1, wherein the labels assigned to the terminals of the matching components include data of at least one node connected to the terminals.

3. The method according to claim 2, wherein the at least one node includes one or more of a power supply node or a ground node.

4. The method according to claim 1, wherein assigning the labels further comprises assigning labels of external inputs.

5. The method according to claim 1, wherein the short path calculation is a shortest path calculation.

6. An apparatus used for physical design validation of an integrated circuit comprising:
- a data collection unit configured to generate data of terminals of components in an integrated circuit according to layout data of the integrated circuit, wherein each component includes a plurality of input and output terminals, the data including one or more of names of the components, names of the terminals and coordinates of the terminals;
- a comparison unit configured to compare an original circuit netlist that includes data of components of the integrated circuit with the layout data of the integrated circuit;
- an assignment unit configured to assign labels to the terminals according to comparison results provided by the comparison unit and the data of the terminals of the components from the data collection unit, wherein a matching component between the original circuit netlist and the layout data is assigned a label for each terminal in the matching component representing matching data of the terminal; and
- a location-finding unit configured to locate a short circuit within the matching component of the integrated circuit using labels of the terminals provided by the assignment unit.

7. The apparatus according to claim 6, wherein the assignment unit assigns labels to the terminals of the matching components in accordance with data of at least one node connected to terminals.

8. The apparatus according to claim 6, wherein the location-finding unit is further configured to locate the position of the short circuit in the integrated circuit in accordance with the labels provided by the assignment unit and external inputs.

9. The apparatus according to claim 6, wherein the location-finding unit is configured to perform a short path calculation.

* * * * *